(12) United States Patent
Juengling

(10) Patent No.: US 10,566,281 B2
(45) Date of Patent: Feb. 18, 2020

(54) INTEGRATED ASSEMBLIES HAVING STRUCTURES ALONG A FIRST PITCH COUPLED WITH STRUCTURES ALONG A SECOND PITCH DIFFERENT FROM THE FIRST PITCH, AND METHODS OF FORMING INTEGRATED ASSEMBLIES

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/443,414

(22) Filed: Jun. 17, 2019

(65) Prior Publication Data
US 2019/0304908 A1    Oct. 3, 2019

Related U.S. Application Data

(62) Division of application No. 15/690,200, filed on Aug. 29, 2017, now Pat. No. 10,361,158.

(51) Int. Cl.
| H01L 21/768 | (2006.01) |
| H01L 21/04 | (2006.01) |
| H01L 21/8239 | (2006.01) |
| H01L 23/528 | (2006.01) |

(Continued)

(52) U.S. Cl.
CPC ...... *H01L 23/5283* (2013.01); *H01L 21/0425* (2013.01); *H01L 21/568* (2013.01);
(Continued)

(58) Field of Classification Search
CPC ..... H01L 23/48; H01L 23/481; H01L 23/482; H01L 23/4824; H01L 23/4825; H01L 23/485; H01L 23/50; H01L 23/52; H01L 23/522; H01L 23/5221; H01L 23/5225; H01L 23/5226; H01L 23/528–5283;
(Continued)

(56) References Cited

U.S. PATENT DOCUMENTS

| 6,727,174 B1 * | 4/2004 | Kotecki | ............ H01L 28/10 438/638 |
| 6,911,389 B2 * | 6/2005 | Brennan | ......... H01L 21/7681 257/E21.579 |

(Continued)

*Primary Examiner* — Maliheh Malek
(74) *Attorney, Agent, or Firm* — Wells St. John P.S.

(57) ABSTRACT

Some embodiments include methods of forming integrated assemblies. First conductive structures are formed within an insulative support material and are spaced along a first pitch. Upper regions of the first conductive structures are removed to form first openings extending through the insulative support material and over lower regions of the first conductive structures. Outer lateral peripheries of the first openings are lined with spacer material. The spacer material is configured as tubes having second openings extending therethrough to the lower regions of the first conductive structures. Conductive interconnects are formed within the tubes. Second conductive structures are formed over the spacer material and the conductive interconnects. The second conductive structures are spaced along a second pitch, with the second pitch being less than the first pitch. Some embodiments include integrated assemblies.

14 Claims, 14 Drawing Sheets

(51) Int. Cl.
　　*H01L 23/053* (2006.01)
　　*H01L 23/538* (2006.01)
　　*H01L 23/00* (2006.01)
　　*H01L 23/29* (2006.01)
　　*H01L 23/31* (2006.01)
　　*H01L 23/532* (2006.01)
　　*H01L 21/56* (2006.01)

(52) U.S. Cl.
　　CPC ...... *H01L 21/76805* (2013.01); *H01L 23/053* (2013.01); *H01L 23/291* (2013.01); *H01L 23/3128* (2013.01); *H01L 23/538* (2013.01); *H01L 23/5329* (2013.01); *H01L 23/5381* (2013.01); *H01L 23/5389* (2013.01); *H01L 24/19* (2013.01); *H01L 21/8239* (2013.01)

(58) Field of Classification Search
　　CPC ... H01L 23/53204; H01L 23/32–53295; H01L 23/535–5381; H01L 23/5383–5386; H01L 23/5389; H01L 25/03; H01L 25/04; H01L 25/065; H01L 25/0655; H01L 25/07; H01L 25/072; H01L 27/0203; H01L 27/0207; H01L 27/10; H01L 27/105; H01L 27/1052; H01L 27/12; H01L 27/1207; H01L 27/1211; H01L 21/04; H01L 21/0425–044; H01L 21/70; H01L 21/768–76805; H01L 21/8239
　　See application file for complete search history.

(56) References Cited

U.S. PATENT DOCUMENTS

| | | | |
|---|---|---|---|
| 6,970,362 B1 * | 11/2005 | Chakravorty | H01L 23/50 257/E23.079 |
| 8,288,083 B2 * | 10/2012 | Zhang | H01L 21/02115 430/322 |
| 9,379,133 B1 * | 6/2016 | Jung | H01L 27/11582 |
| 10,008,504 B1 * | 6/2018 | Juengling | H01L 27/10847 |
| 10,236,215 B1 * | 3/2019 | Xie | H01L 29/41791 |
| 10,381,305 B2 * | 8/2019 | Juengling | H01L 21/76879 |
| 10,388,606 B2 * | 8/2019 | Juengling | H01L 21/76879 |
| 2005/0277249 A1 * | 12/2005 | Juengling | H01L 27/10814 438/257 |
| 2008/0315348 A1 * | 12/2008 | Xu | H01L 23/522 257/506 |
| 2009/0075428 A1 * | 3/2009 | Tang | H01L 21/561 438/114 |
| 2009/0166872 A1 * | 7/2009 | Chung | H01L 27/105 257/754 |
| 2012/0126338 A1 * | 5/2012 | Juengling | H01L 21/823431 257/401 |
| 2013/0256902 A1 * | 10/2013 | Lu | H01L 23/5226 257/774 |
| 2014/0252464 A1 * | 9/2014 | Sell | H01L 21/76897 257/330 |
| 2014/0349476 A1 * | 11/2014 | Chen | H01L 21/76816 438/620 |
| 2015/0143319 A1 * | 5/2015 | Lee | G06F 17/5068 716/118 |
| 2015/0228659 A1 * | 8/2015 | Vu | H01L 27/11519 257/66 |
| 2016/0043047 A1 * | 2/2016 | Shim | H01L 21/561 257/773 |
| 2017/0154848 A1 * | 6/2017 | Fan | H01L 21/76805 |
| 2018/0182762 A1 * | 6/2018 | Juengling | H01L 27/10826 |
| 2018/0364567 A1 * | 12/2018 | Chou | G03F 7/0035 |
| 2019/0027434 A1 * | 1/2019 | Jung | H01L 23/528 |
| 2019/0067183 A1 * | 2/2019 | Liu | H01L 27/10805 |
| 2019/0067193 A1 * | 2/2019 | Juengling | H01L 27/115 |
| 2019/0067195 A1 * | 2/2019 | Juengling | H01L 23/5283 |
| 2019/0287905 A1 * | 9/2019 | Lee | H01L 23/5226 |
| 2019/0287972 A1 * | 9/2019 | Hafez | H01L 27/0924 |

* cited by examiner

US 10,566,281 B2

INTEGRATED ASSEMBLIES HAVING STRUCTURES ALONG A FIRST PITCH COUPLED WITH STRUCTURES ALONG A SECOND PITCH DIFFERENT FROM THE FIRST PITCH, AND METHODS OF FORMING INTEGRATED ASSEMBLIES

RELATED PATENT DATA

This patent resulted from a divisional of U.S. patent application Ser. No. 15/690,200 which was filed Aug. 29, 2017, and which is hereby incorporated herein by reference.

TECHNICAL FIELD

Integrated assemblies having structures along a first pitch coupled with structures along a second pitch different from the first pitch, and methods of forming integrated assemblies.

BACKGROUND

Integrated circuitry may include highly-integrated structures formed along a relatively tight (i.e., small) pitch in order to achieve a high packing density. For instance, memory cells may be arranged in a configuration having a high packing density. The memory cells may be addressed utilizing wordlines and digit lines; with the wordlines extending along a first direction and the digit lines extending along a second direction which intersects the first direction. The wordlines and digit lines may be formed along a tight pitch in order to enable suitable addressing of the tightly-packed memory cells.

The integrated circuitry may also include structures formed along a relatively loose (i.e., large) pitch. Such structures may include logic, wordline drivers, sense amplifiers, sensors, etc. The terms "relatively loose" and "relatively tight" are utilized in relation to one another, with the relatively loose pitch being larger than the relatively tight pitch.

It may be desired to couple the structures formed along the relatively loose pitch with the structures formed along the relatively tight pitch. For instance, it may be desired to couple wordline drivers with wordlines, sense amplifiers with digit lines, etc. It can be difficult to achieve such coupling, and accordingly it is desired to develop methods and architectures suitable for coupling structures formed along a relatively loose pitch with structures formed along a relatively tight pitch.

DETAILED DESCRIPTION OF THE ILLUSTRATED EMBODIMENTS

Integrated circuitry may include connections between features formed at a relatively tight pitch and features formed at a relatively loose pitch. Embodiments described herein may provide methods and architectures for achieving such connections.

Figure 1:
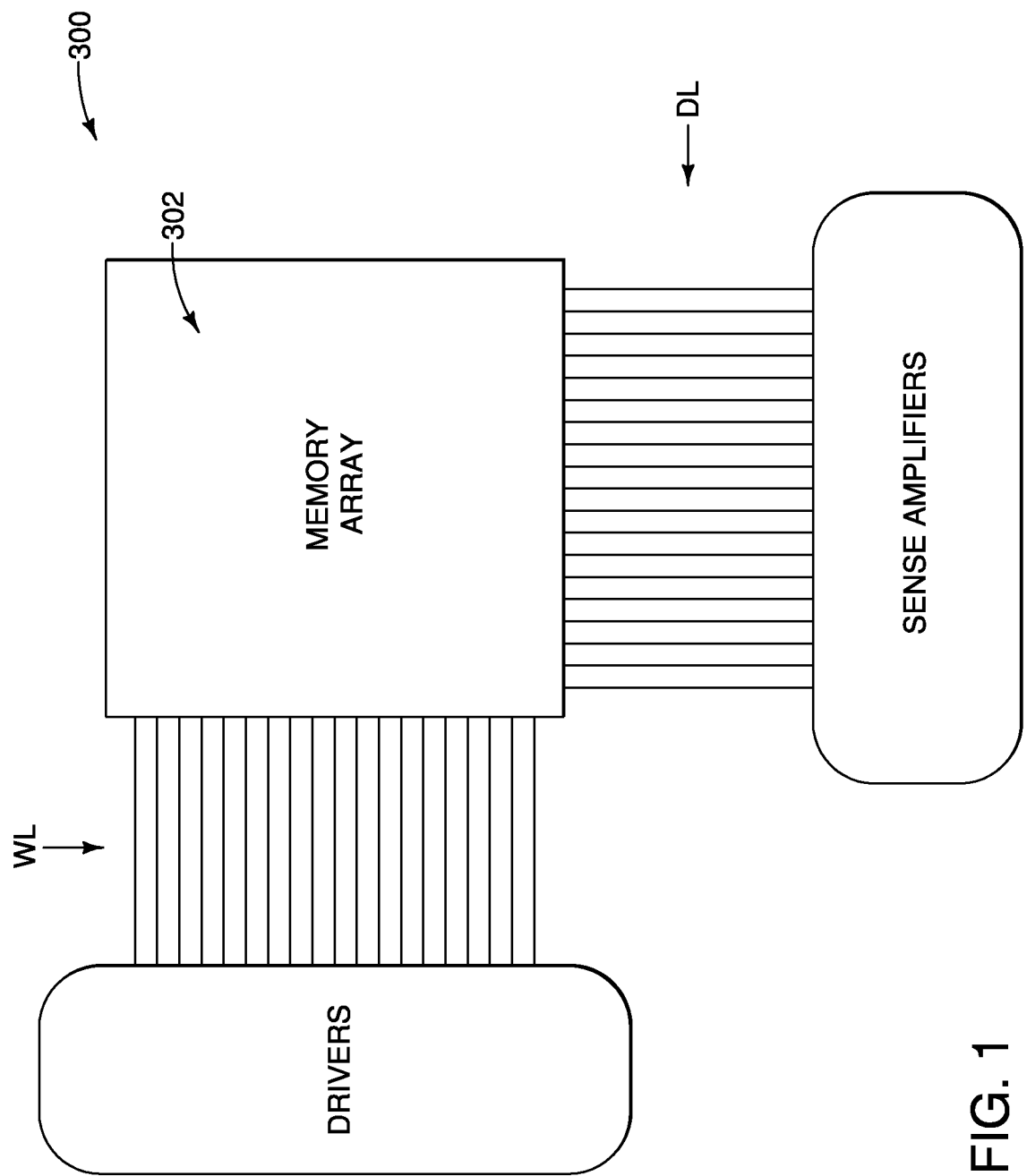
FIG. 1 is a diagrammatic schematic view of portions of an example integrated circuit.

FIG. 1 shows a region of an integrated circuit 300, and shows an example application in which connections may be formed between relatively tightly-pitched features and relatively loosely-pitched features. The integrated circuit 300 includes a memory array 302, which may have a plurality of memory cells formed in a high-density array. The memory array comprises rows and columns. Wordlines WL extend into the memory array 302 along the rows of the array; and digit lines DL extend into the memory array 302 along the columns of the array. The rows and columns may be orthogonal to one another, or may intersect along any suitable angle, such as, for example, 30°, 45°, 60°, etc. Each memory cell within the memory array may be uniquely addressed with the combination of a wordline WL and a digit line DL. A relatively small number of wordlines WL and digit lines DL are shown in FIG. 1 for purposes of illustration. In actual practice, there may be thousands, millions, hundreds of millions, billions, etc., of memory cells within the memory array, and an associated large number of wordlines WL and digit lines DL extending into the memory array.

The wordlines WL and digit lines DL are provided at a relatively tight pitch in order to extend across the rows and columns of the densely-packed memory cells within the memory array 302. The wordlines WL and the digit lines DL extend to circuitry external of the memory array, and such circuitry may be provided at a relatively-loose pitch. For instance, the wordlines WL are shown extending to wordline drivers, and the digit lines DL are shown extending to sense amplifiers.

Figure 2:
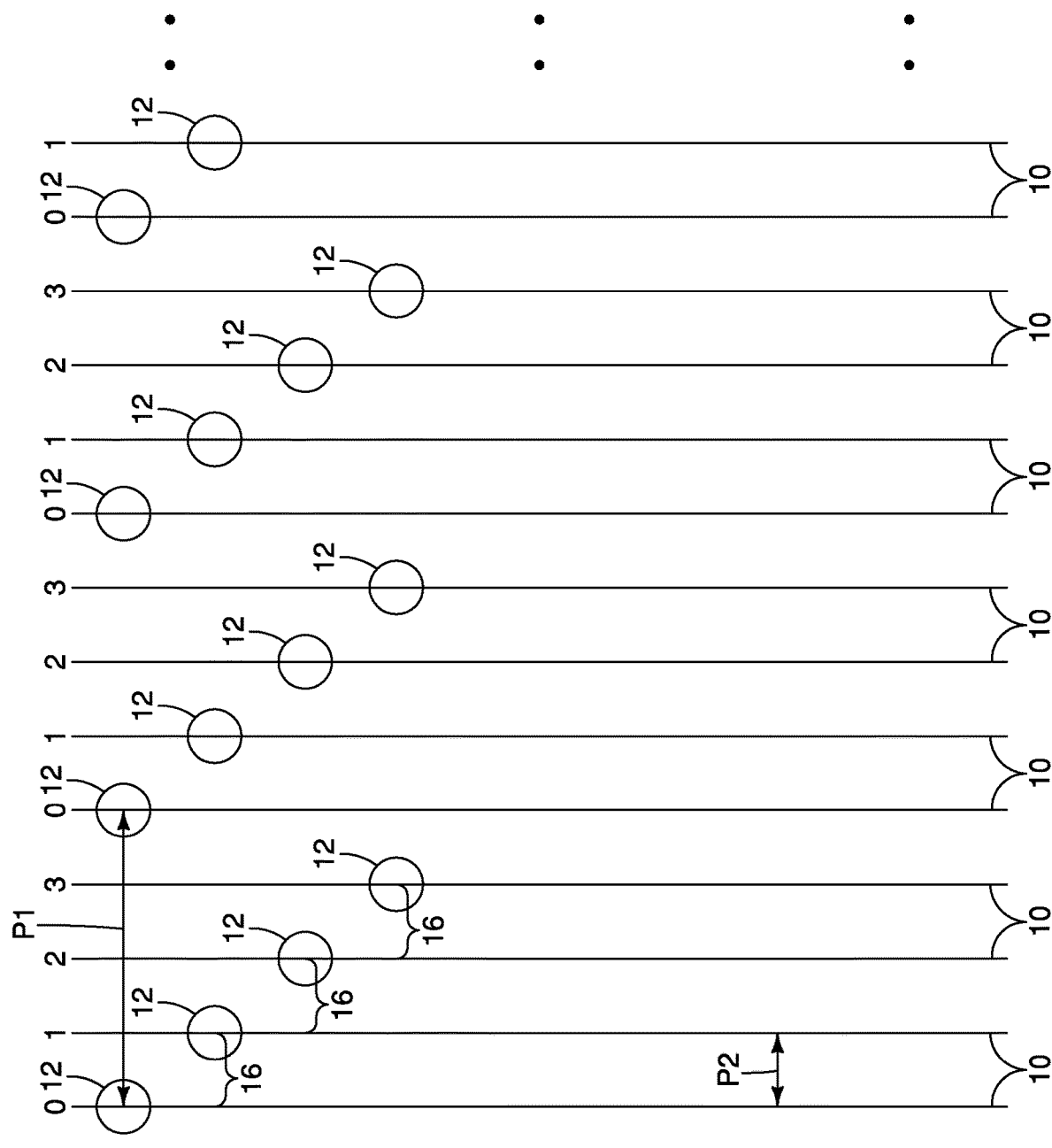
FIG. 2 is a diagrammatic schematic view of a region of an example integrated circuit, and such region may be an expanded region of the integrated circuit of FIG. 1.

The actual connections between the tightly-pitched structures and the loosely-pitched structures may utilize a repeating pattern of conductive structures. For instance, FIG. 2 shows a pattern which may be utilized for coupling tightly-pitched features (e.g., lines 10) with more loosely-pitched features through conductive structures 12 which are on a pitch substantially identical to the pitch of the loosely-pitched features (with the term "substantially identical" meaning identical to within reasonable tolerances of fabrication and measurement). The lines 10 may be, for example, the wordlines WL or digit lines DL described above with reference to FIG. 1; and the more loosely-pitched features may correspond to, for example, features associated with wordline drivers or sense amplifiers relative to the application of FIG. 1.

In the illustrated embodiment of FIG. 2, the tightly-pitched features 10 are on a pitch P2 and the conductive structures 12 are on a pitch P1, with the pitch P1 being about four-times greater than the pitch P2. In some embodiments, the pitches P1 and P2 may be referred to as first and second pitches, respectively.

A bar of repeating numbers 0, 1, 2, 3 is provided over the lines 10 to assist the reader in recognizing a repeating pattern formed between the lines 10 and the conductive structures 12. In other embodiments, the relationship between the pitches P1 and P2 may be different than the illustrated 4:1 relationship, and accordingly the repeating pattern may be different. Generally, the pitch P1 will be at least about three-times as large as the pitch P2.

In some embodiments, the lines 10 may be considered to extend along a direction represented by an axis 7. The conductive structures 12 may be considered to be formed along rows 14a-14d which extend along another direction represented by an axis 5. The term "row" as utilized relative to FIG. 2 (and the FIGS. 3-11 which follow) is not to be confused with the rows extending across the memory array 302 of FIG. 1. Specifically, the rows extending across the memory array 302 are associated with wordlines. In contrast, the rows 14 described with reference to FIGS. 2-11 are simply rows along which conductive structures may be fabricated, and may be along any suitable direction associated with integrated circuitry; including, for example, the row direction of FIG. 1, the column direction of FIG. 1, etc.

The axes 5 and 7 are substantially orthogonal to one another in the embodiment of FIG. 2, with the term "substantially orthogonal" meaning orthogonal to within reasonable tolerances of fabrication and measurement. In some embodiments, the relative directions of axes 5 and 7 may be referred to as first and second directions, respectively. Adjacent rows 14 are offset relative to one another along the first direction of axis 5 by an increment 16 corresponding to the pitch P2 (or in other words by a fraction of the pitch P1, and in the illustrated embodiment by an increment corresponding to about one-fourth of the pitch P1). Specifically, the row 14b is offset along the first direction of axis 5 from the row 14a by the increment 16, the row 14c is offset along the first direction of axis 5 from the row 14b by the increment 16, and the row 14d is offset along the first direction of axis 5 from the row 14c by the increment 16.

Although the axes 5 and 7 are shown to be substantially orthogonal to one another, in other embodiments the rows (e.g., 14a-14d) may extend along an axis which is at an angle other than 90° relative to the direction of lines 10. Such angle may be any suitable angle, such as, for example, about 30°, about 45°, about 60°, etc. In some embodiments, the ratio of the change in the x direction (the direction along axis 5) relative to the change in the y-direction (the direction along axis 7) as pertaining to the locations of conductive structures 12 may be 1:4; 1:3, 1:2, etc.

Each of the conductive lines 10 within the configuration of FIG. 2 is uniquely coupled to one of the conductive structures 12.

Figure 3:
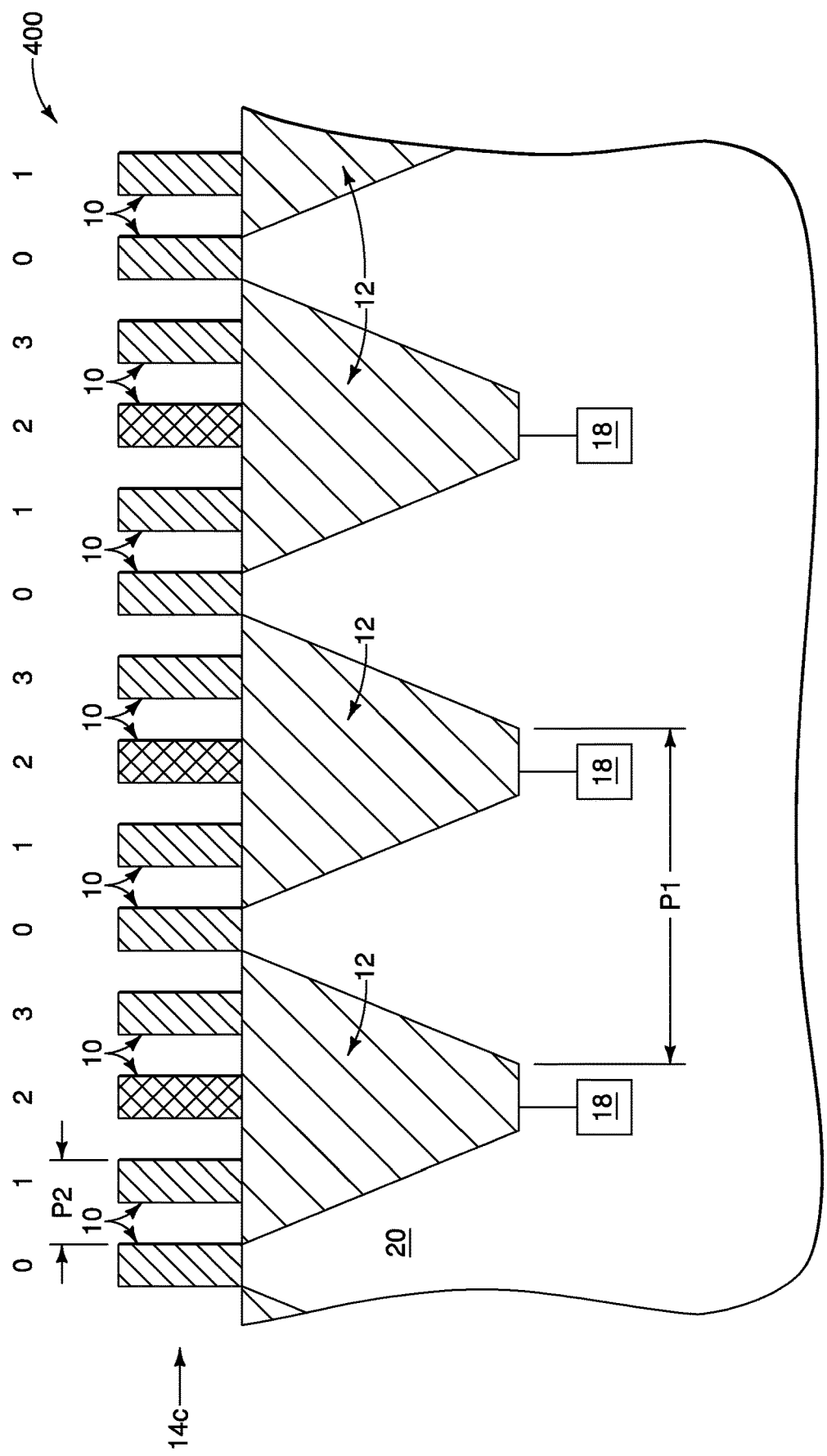
FIG. 3 is a diagrammatic cross-sectional side view of a portion of an example integrated circuit illustrating coupling between features formed along a relatively tight pitch with features formed along a relatively loose pitch.

FIG. 3 shows a construction 400 illustrating a difficulty which may occur in attempting to specifically couple some of the conductive lines 10 within one of the rows 14a-14d to the conductive structures 12. The construction 400 is shown along a cross-section through the row 14c. The lines 10 are shown to be along the pitch P2, and the conductive structures 12 are shown to be along the pitch P1. The conductive structures 12 extend to circuitry 18. The circuitry 18 may correspond to any suitable circuitry including, for example, wordline drivers, sense amplifiers, etc. The conductive structures 12 are within an insulative support material 20.

The bar of repeating numbers 0, 1, 2, 3 is provided over the lines 10 of FIG. 3, and each line at position 2 is illustrated with different crosshatching relative to the other lines to indicate that the line at position 2 is the specific line which is to be connected with the underlying conductive structure 12 relative to the cross-section along the row 14c. Unfortunately, other lines 10 are directly over and against the conductive structures 12 in addition to the lines 10 at positions 2. For instance, the lines 10 at positions 1 and 3 are also directly over and against portions of the conductive structures 12, and accordingly will short to the conductive structures 12 in the architecture of construction 400.

Figure 4:
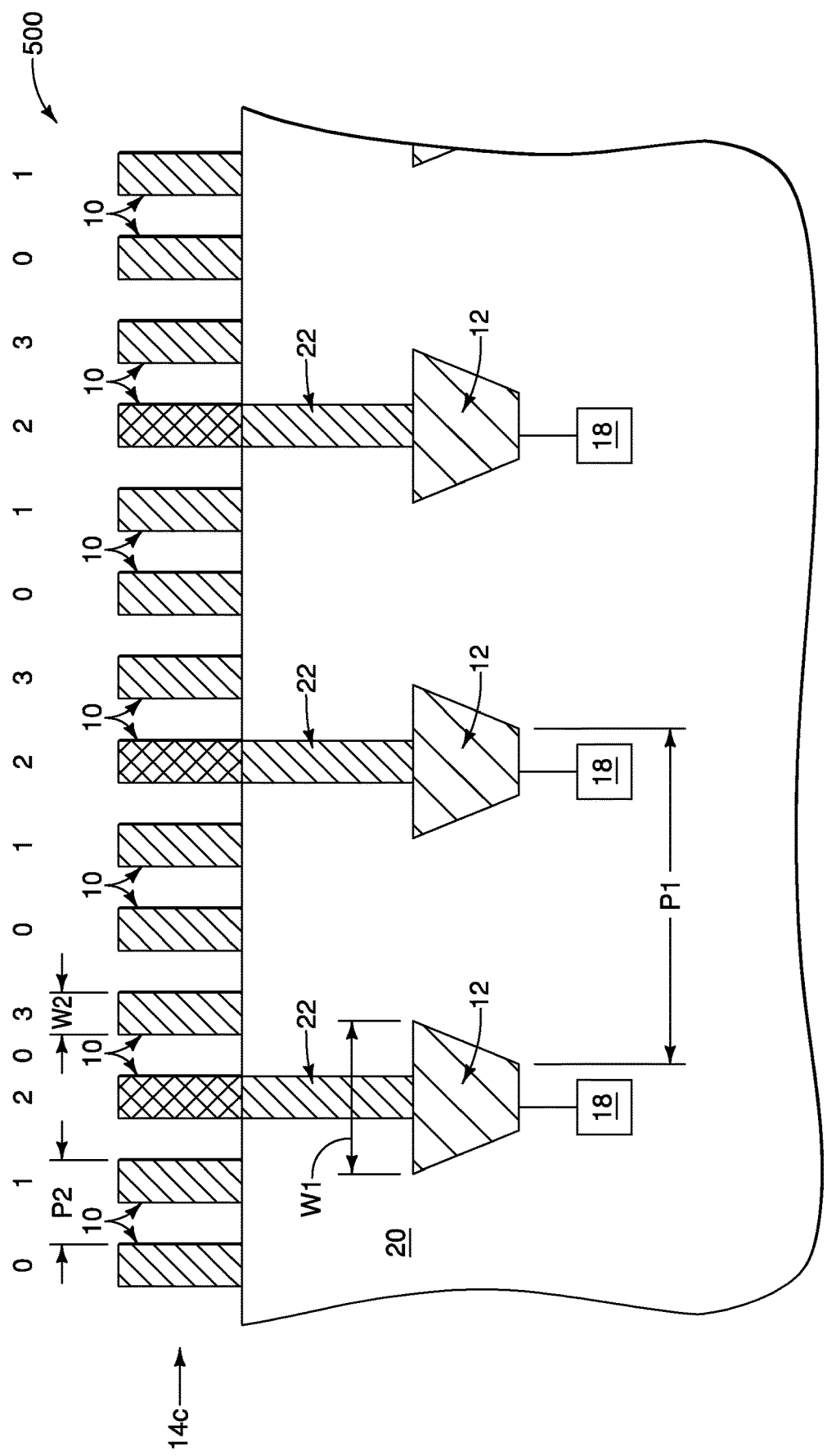
FIG. 4 is a diagrammatic cross-sectional side view of a portion of an example integrated circuit illustrating coupling between features formed along a relatively tight pitch with features formed along a relatively loose pitch, and avoiding problems described relative to the structure of FIG. 3.

FIG. 4 shows a construction 500 which alleviates the problem described above with reference to FIG. 3. Specifically, the conductive structures 12 are recessed within the insulative support material 20, and thin interconnects 22 are provided to extend upwardly from the conductive structures 12 to selectively connect with the lines 10 at positions 2 relative to the lines 10 at all other positions (i.e., at positions 0, 1 and 3 in the illustrated application). In some embodiments, the conductive structures 12 may be referred to as first conductive structures which are spaced along the first pitch P1, and the lines 10 may be referred to as second conductive structures over the first conductive structures 12 and which are spaced along the second pitch P2. The first conductive structures 12 have a first width W1 along the cross-section of FIG. 4, and the second conductive structures 10 have a second width W2 along the cross-section, with the second width being less than the first width.

More than one of the second conductive structures 10 is directly over each of the first conductive structures 12 (for instance, the conductive structures 10 at positions 1, 2 and 3 are all directly over the underlying conductive structures 12). The conductive interconnects 22 extend upwardly from each of the first conductive structures 12 to couple the first conductive structures 12 with only one of the second conductive structures 10 which is directly over each of the first conductive structures 12 (for instance, in the shown application it is only the second conductive structures 10 at positions 2 which are electrically coupled with the underlying first conductive structures 12 through the interconnects 22). The second conductive structures 10 which are over the first conductive structures 12 and not electrically coupled to the first conductive structures 12 (i.e., the second conductive structures 10 at positions 1 and 3 in the shown application of FIG. 4) are vertically spaced from the first conductive structures 12 by intervening insulative material 20.

In the illustrated application of FIG. 4, the second pitch P2 is about one-fourth of the first pitch P1. In other applications, the second pitch P2 may be a different fraction relative to the first pitch P1. Generally, the problems associated with coupling loosely-pitch structures with tightly-pitch structures become increasingly significant as the disparity between the loose pitch and the tight pitch increases, and accordingly the tight pitch P2 would generally be less than or equal to about one-half of the loose pitch P1 relative to the applications described herein (and in some embodiments may be less than or equal to about one-third of the loose pitch P1).

The construction 500 of FIG. 4 is shown along the row 14c. The construction would have similar configurations along the other rows 14a, 14b and 14d of FIG. 2, with such other configurations connecting the first conductive structures 12 with the second conductive structures 10 at others of the positions 0, 1, 2 and 3 as appropriate relative to the configuration described with reference to FIG. 2.

The construction 500 of FIG. 4 may be formed with any suitable processing. Example processing is described with reference to FIGS. 5-11.

Figure 5:
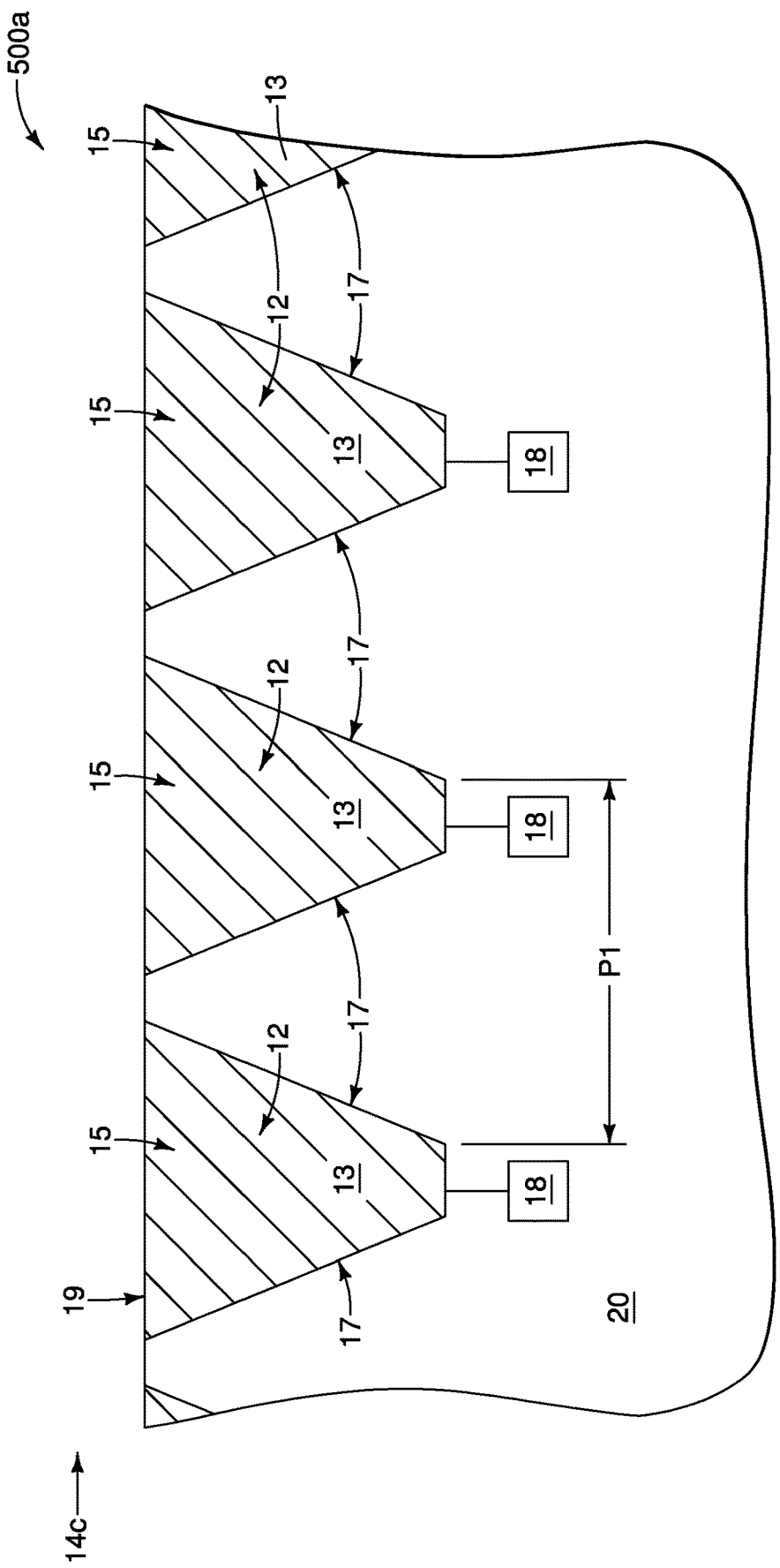
FIGS. 5-11 are diagrammatic cross-sectional side views of a portion of an example construction at example processing stages of an example method for coupling features along a relatively tight pitch with features along a relatively loose pitch.

Referring to FIG. 5, a construction 500a is shown at a processing stage after the first conductive structures 12 are provided within the insulative support material 20; with the first conductive structures 12 being spaced along the first pitch P1. The pitch P1 may be any suitable pitch, and in some embodiments may be within a range of from about 100 nanometers (nm) to about 1000 nm.

The conductive structures 12 are electrically coupled with the circuitry 18 described above. The conductive structures may be arranged in the rows 14a-14d described above with reference to FIG. 2, and the conductive structures 12 along the row 14c are specifically illustrated relative to the cross-section of FIG. 5.

The insulative support material 20 may comprise any suitable composition or combination of compositions; and in some embodiments may comprise, consist essentially of, or consist of silicon dioxide. The insulative support material 20 may be provided over an underlying base (not shown) corresponding to a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The first conductive structures 12 comprise conductive material 13. The conductive material 13 may comprise any suitable electrically conductive composition(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive structures 12 may be considered to be formed within openings 15 that extend into the insulative support material 20. In the illustrated embodiment, the conductive structures 12 have angled sidewalls 17 which commonly result as openings are etched into an underlying support material. In other embodiments, the sidewalls 17 may be vertical, or may have other configurations.

The construction 500a is shown to have a planarized upper surface 19 extending across the insulative support material and the conductive structures 12. Such planarized surface 19 may result from chemical-mechanical polishing (CMP) or any other suitable polishing process.

Figure 5A:
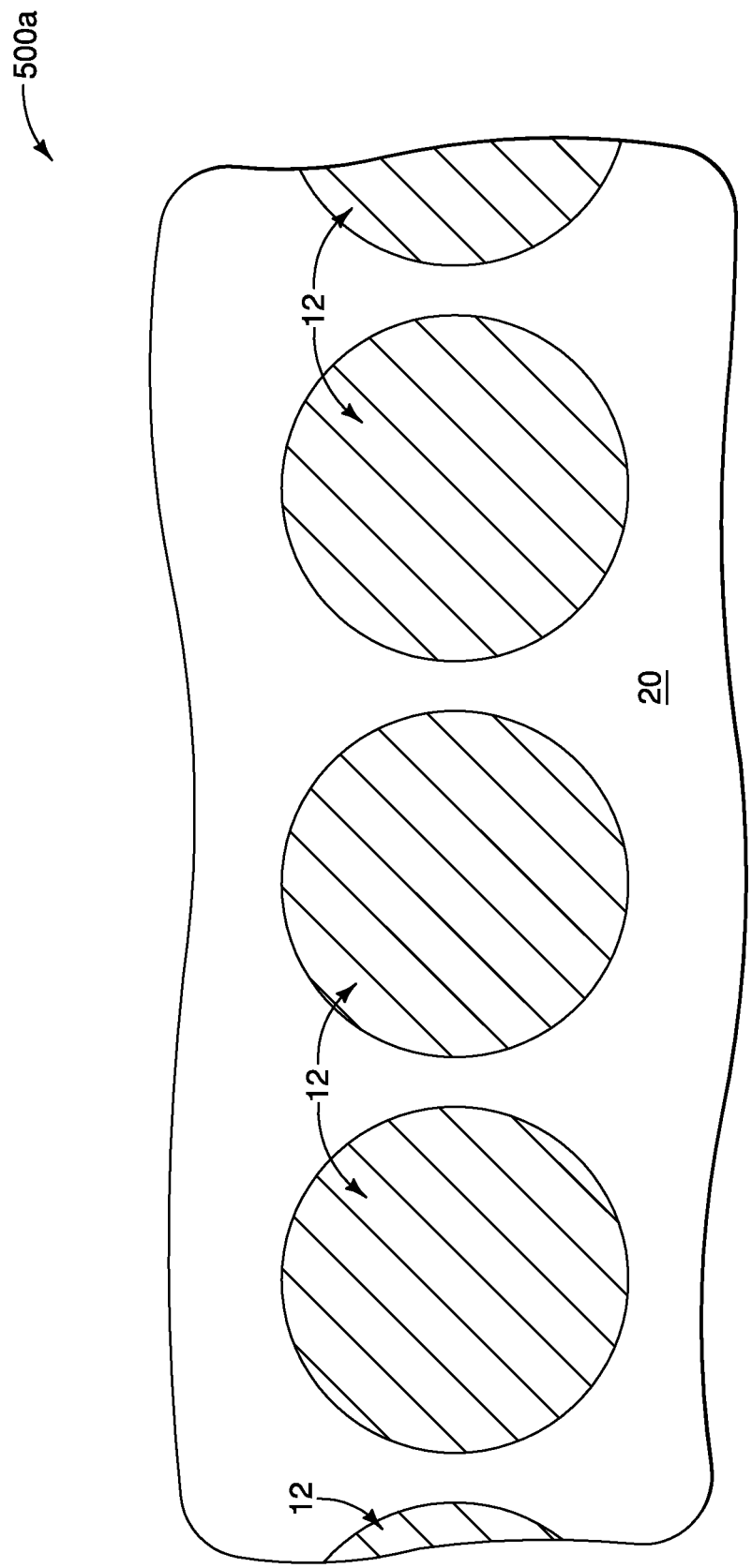
FIGS. 5A, 8A and 10A are diagrammatic top views of regions of the constructions of FIGS. 5, 8 and 10, respectively.

FIG. 5A shows a top view of a portion of the construction 500a at the processing stage of FIG. 5, and shows that the structures 12 may have closed shapes when viewed from above. In the illustrated embodiment, the structures 12 have circular shapes, but in other embodiments the structures 12 may have other shapes; such as, for example, elliptical shapes, polygonal shapes, etc.

Figure 6:
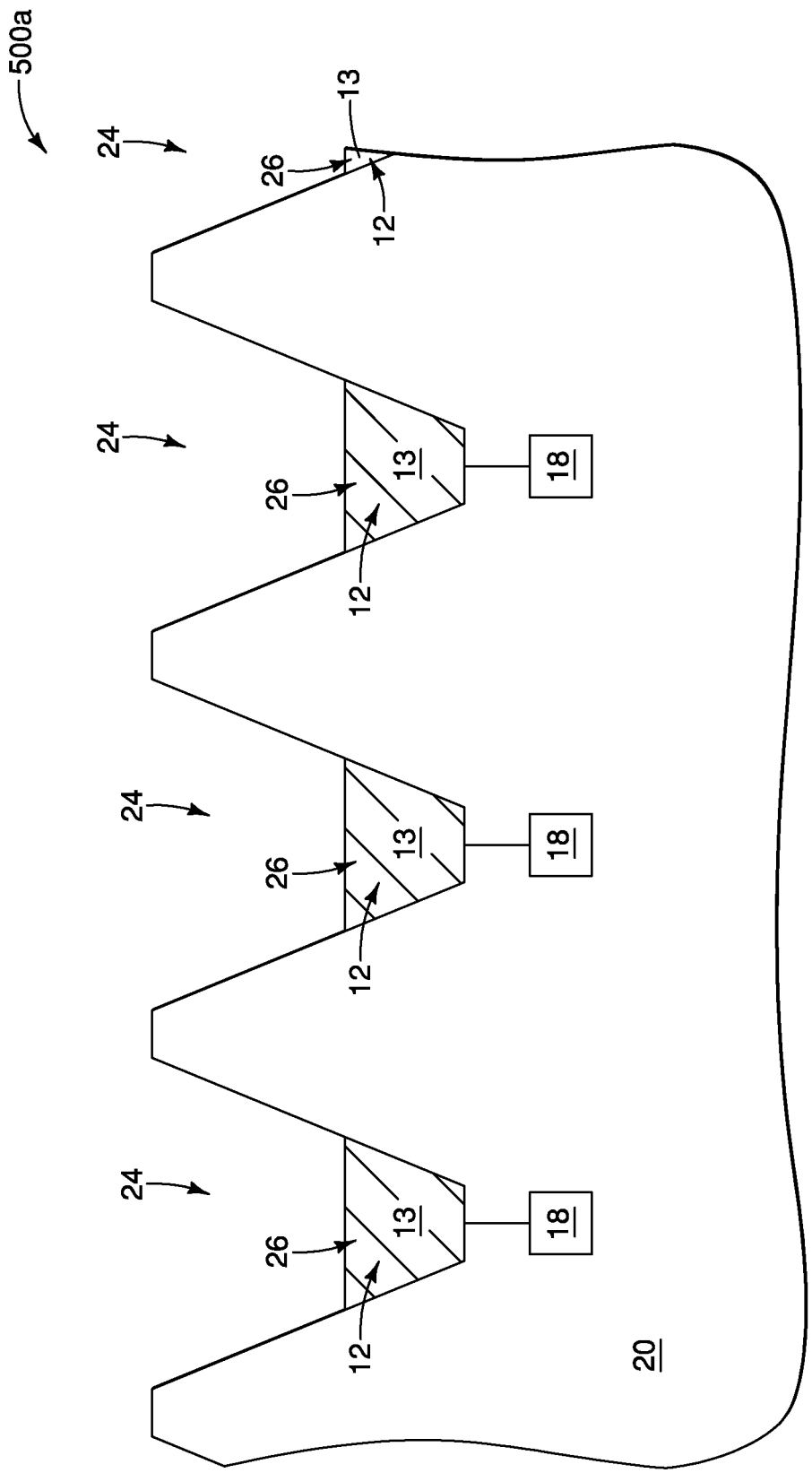

Referring to FIG. 6, upper portions of the first conductive structures 12 are removed to form first openings 24 extending into the insulative support material 20; with the first openings 24 extending to lower regions 26 of the first conductive structures 12.

Figure 7:
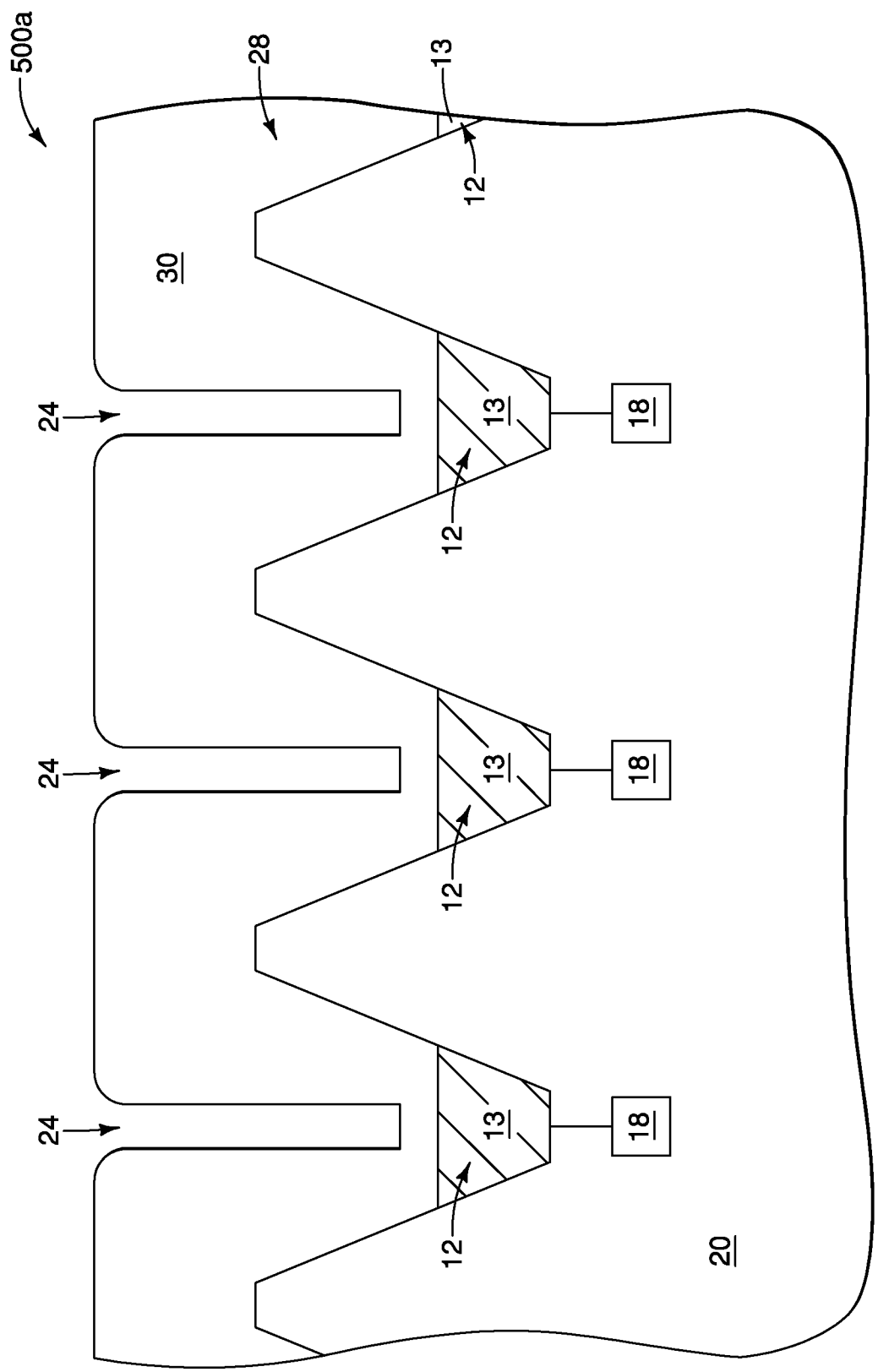

Referring to FIG. 7, a layer 28 of spacer material 30 is formed over the insulative support material 20 and within the first openings 24. The spacer material 30 only partially fills the first openings 24, and accordingly narrows the first openings 24.

The spacer material 30 may comprise any suitable composition or combination of compositions; including, for example, one or both of silicon nitride and silicon dioxide. In some embodiments, the spacer material 30 may comprise a same composition as the insulative support material 20; and in other embodiments the spacer material 30 may comprise a different composition relative to the insulative support material 20.

Figure 8:
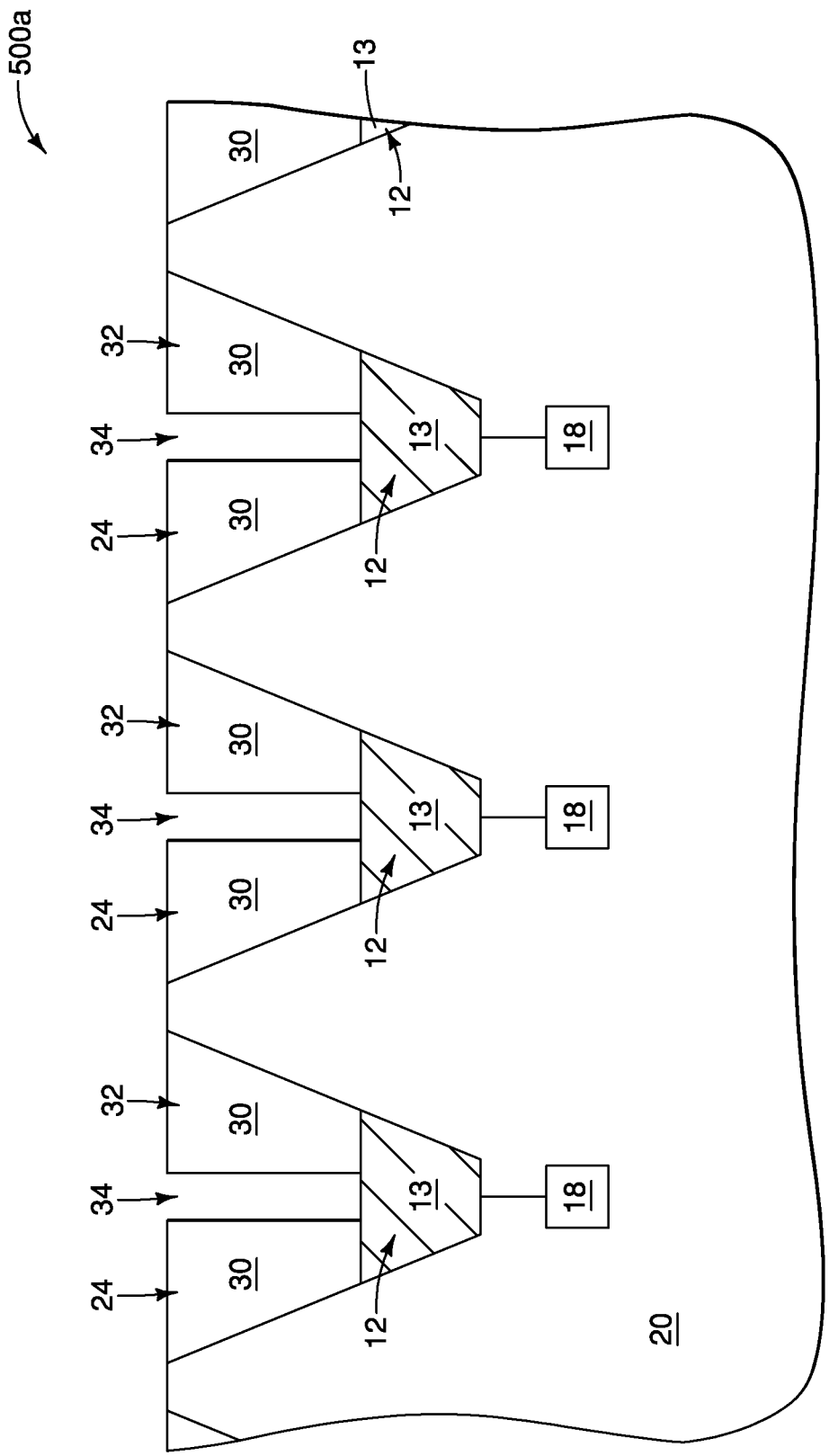
Figure 8A:
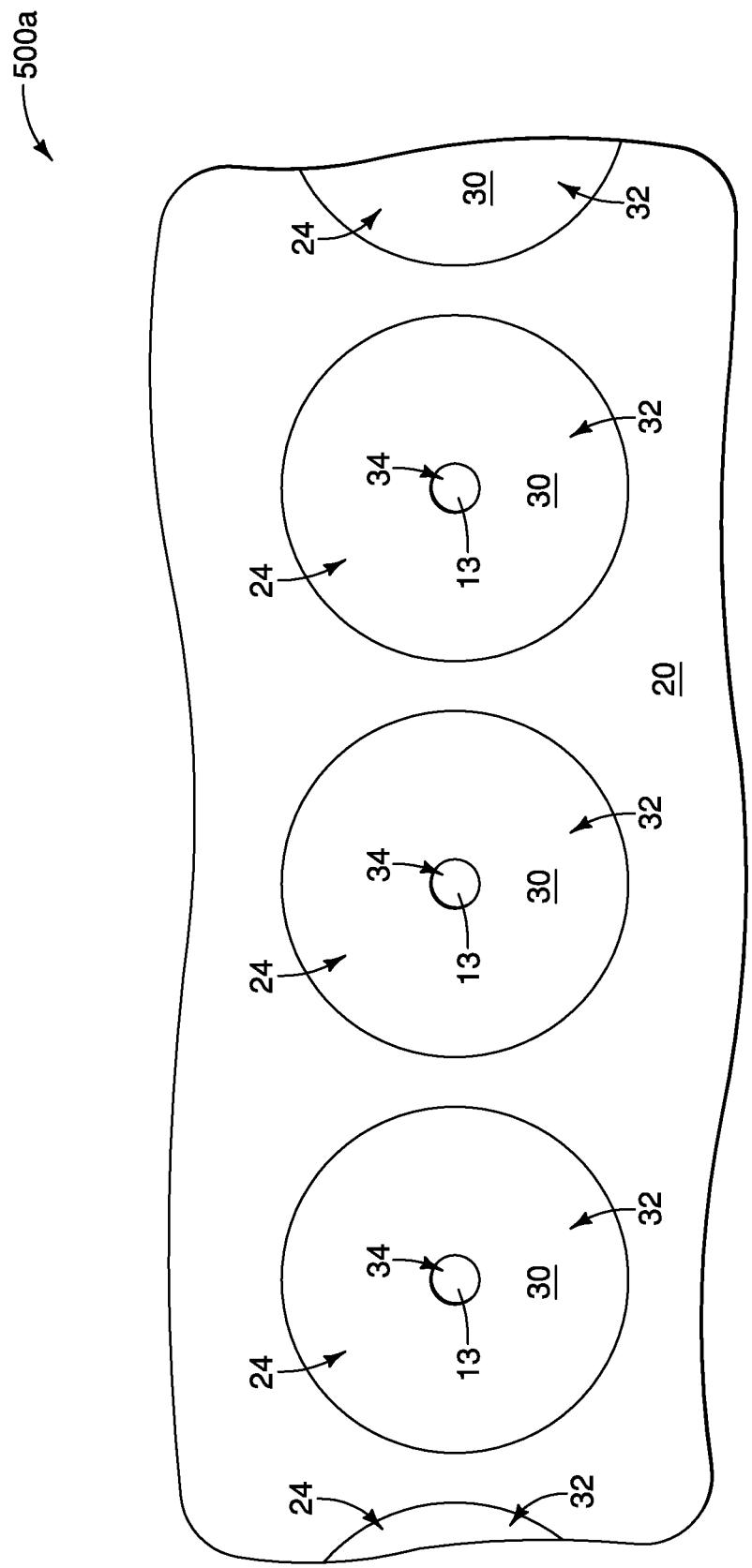

Referring to FIG. 8, the spacer material 30 is anisotropically etched to form the spacer material 30 into tubes 32 having second openings 34 extending therethrough. The conductive material 13 of conductive structures 12 is exposed at the bottoms of the second openings 34. FIG. 8A shows a top view of a portion of the construction 500a at the processing stage of FIG. 8, and more clearly illustrates the second openings 34 extending through tubes 32 of the spacer material 30.

The spacer material 30 may be considered to line outer lateral peripheries of the first openings 24 at the processing stage of FIGS. 8 and 8A.

Figure 9:
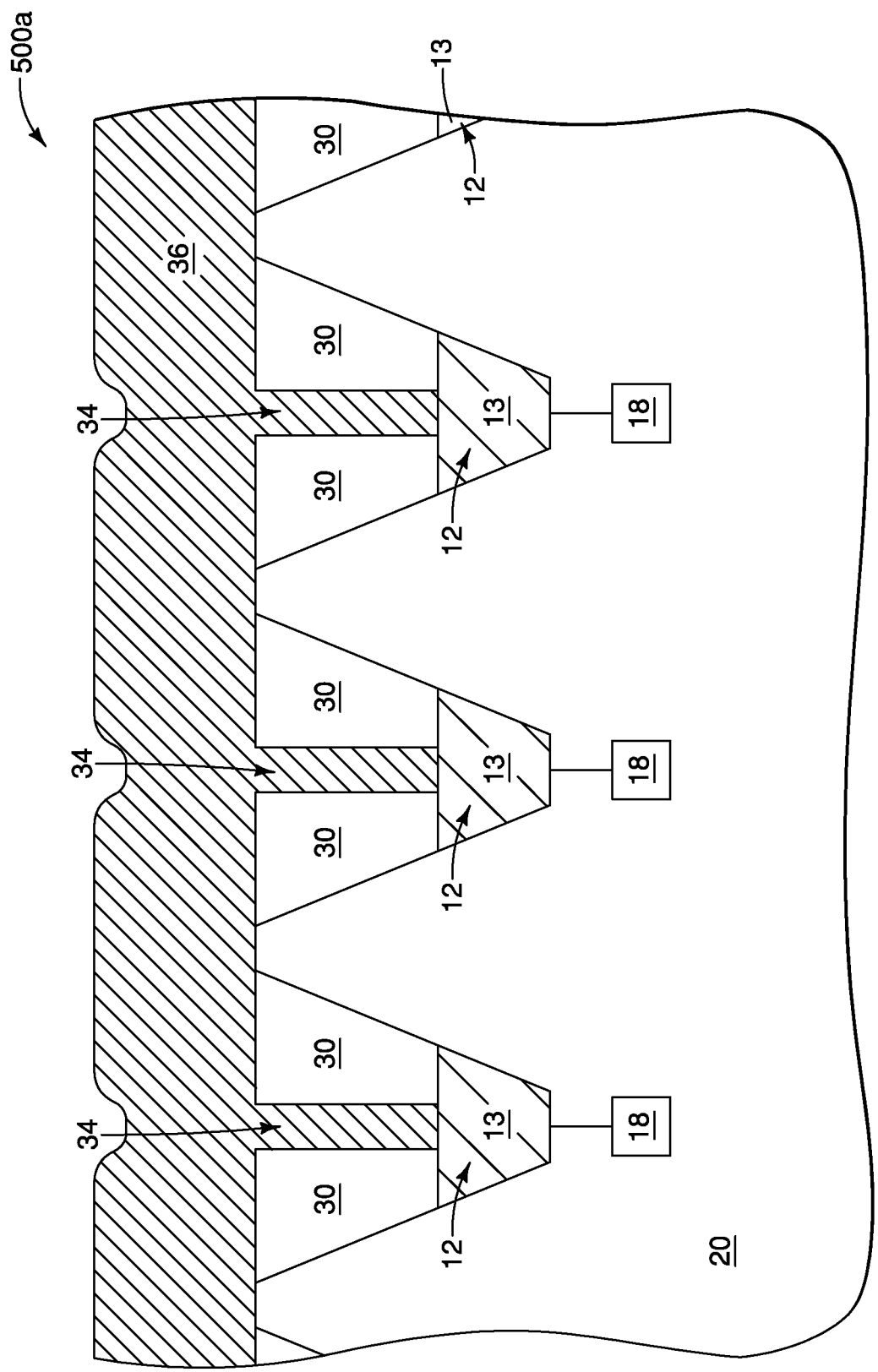

Referring to FIG. 9, conductive material 36 is formed over the insulative support material 20 and within the second openings 34. The conductive material 36 may comprise any suitable electrically conductive composition(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

Figure 10:
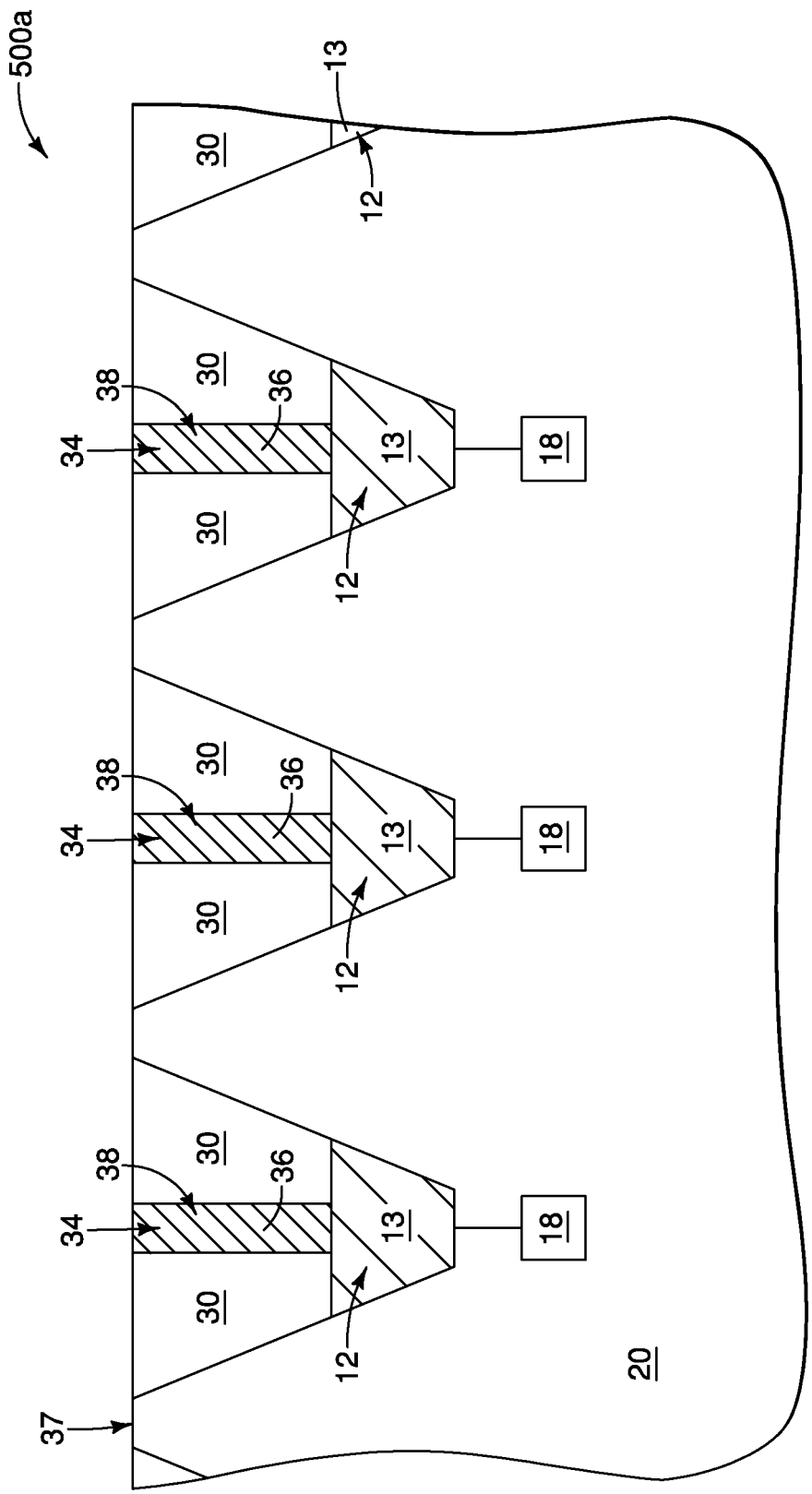

Referring to FIG. 10, the conductive material 36 is removed from over the insulative support material 20 with a planarizing process (for instance, CMP), which forms conductive interconnects 38 from the conductive material 36 within the second openings 34, and which forms a planarized upper surface 37 extending along the insulative support material 20, the spacer material 30, and the conductive material 36 of the interconnects 38.

Figure 10A:
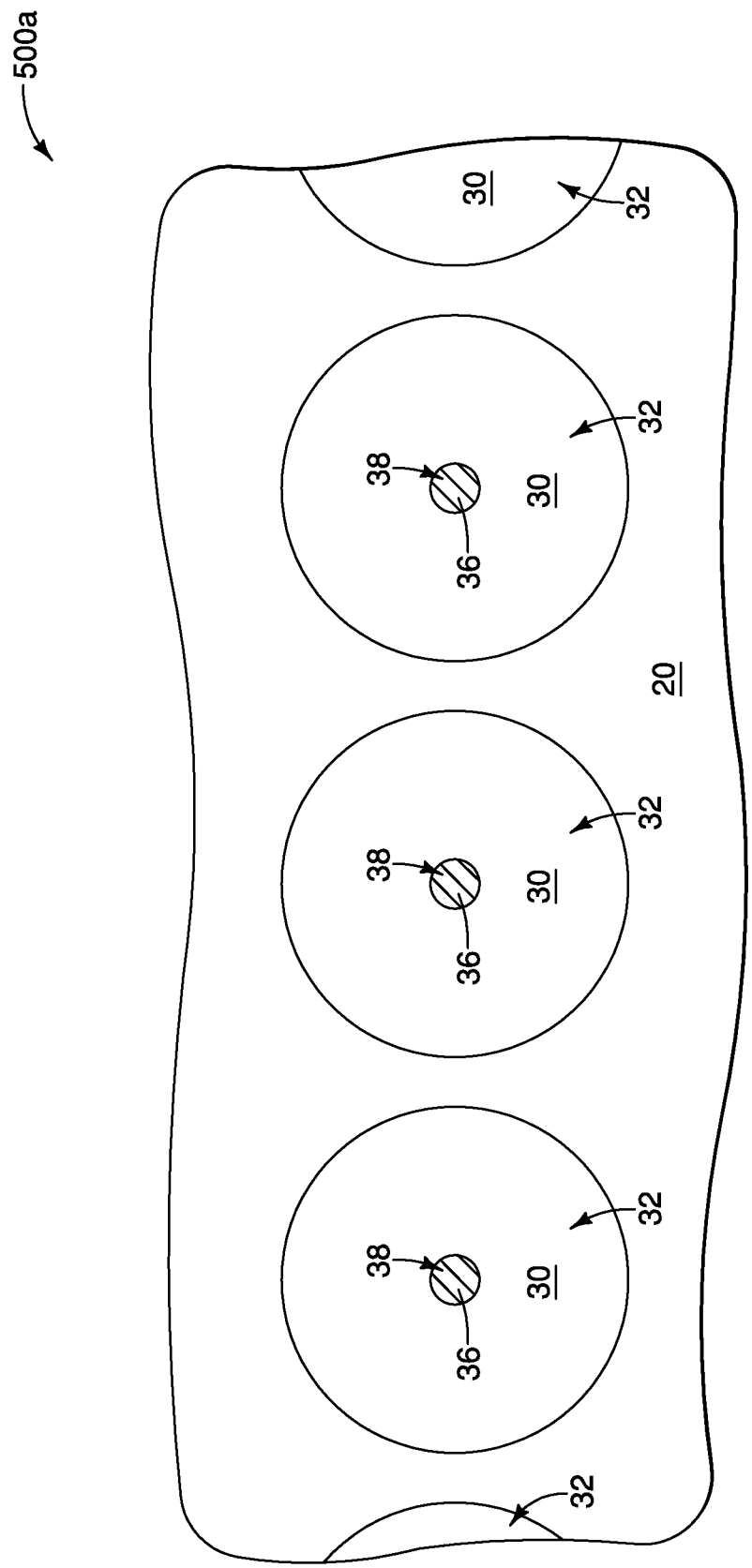

FIG. 10A shows a top view of a portion of the construction 500a at the processing stage of FIG. 10, and shows the interconnects 38 extending within the tubes 32 of spacer material 30. In some embodiments, the interconnects 38 may be considered to extend upwardly from the conductive structures 12 (FIG. 10) and within the tubes 32 of the spacer material 30.

Figure 11:
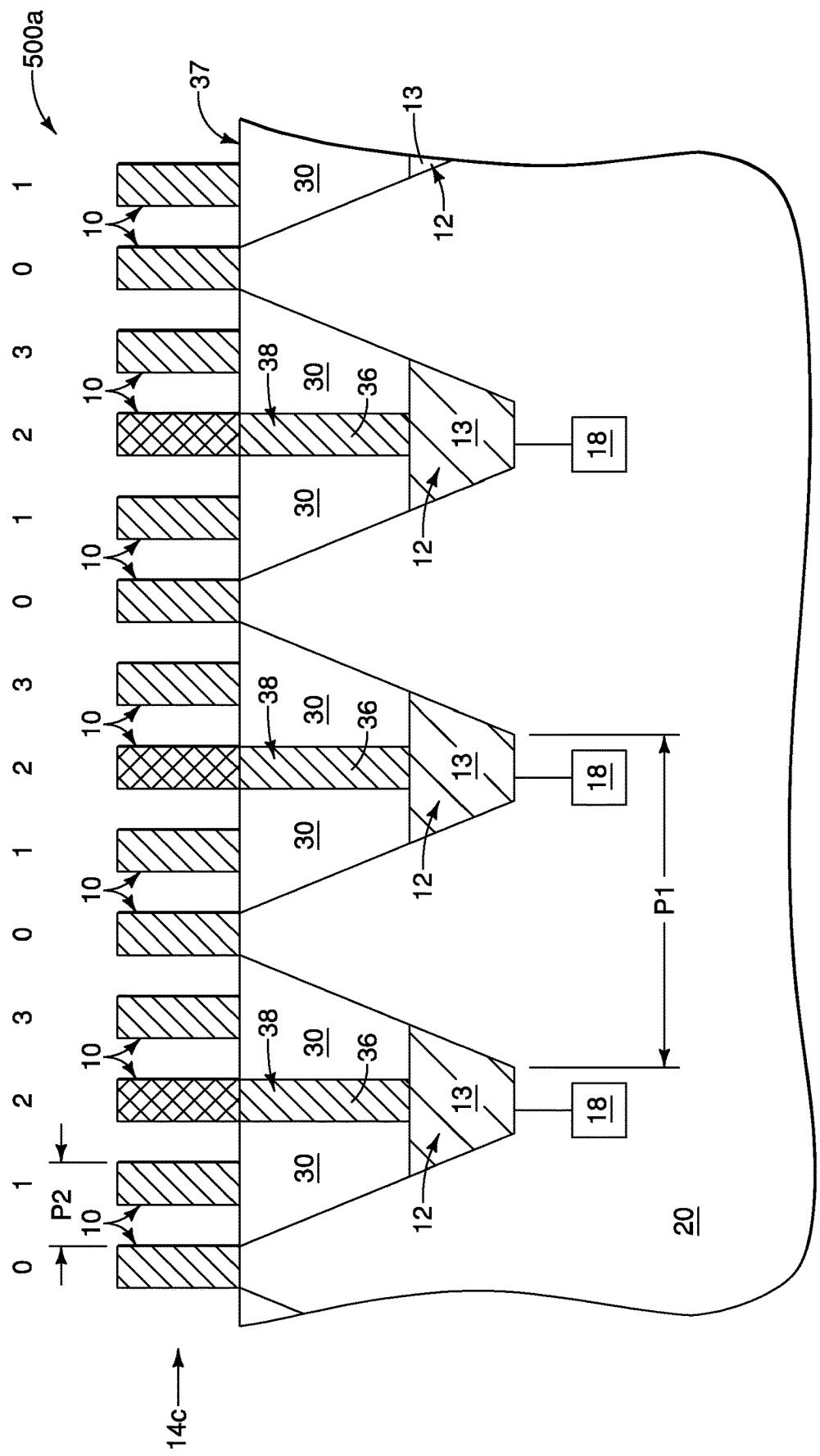

Referring to FIG. 11, the second conductive structures 10 are formed over the spacer material 30, the conductive interconnects 38 and the insulative support material 20. In the illustrated embodiment, the second conductive structures 10 are formed directly on the planarized upper surface 37. The second conductive structures are spaced from one another along the second pitch P2, which in some embodiments is less than or equal to about one-half of the first pitch P1 spacing the first conductive structures 12. In the illustrated embodiment, the second pitch P2 is about one-fourth of the first pitch P1.

The second conductive structures 10 are along the row 14c of FIG. 2, and the second conductive structures 10 at positions 2 are coupled with the first conductive structures 12 through the interconnects 38. Notably, the conductive structures 10 at positions 1 and 3 are directly over the first conductive structures 12, but are vertically spaced from such conductive structures by the insulative spacer material 30. The second conductive structures 10 at positions 0 are directly against the insulative support material 20, and are not directly over the first conductive structures 12 in the illustrated embodiment. In some embodiments, the second conductive structures 10 at the positions 0 may be referred to as additional conductive structures to distinguish them from the second conductive structures 10 at positions 1, 2 and 3 which are directly over the first conductive structures 12. The second conductive structures 10 at positions 1 and 3 may be considered to be directly against an intervening insulative material corresponding to the spacer material 30, and such intervening insulative material may be referred to as a first insulative material. The additional second conductive structures 10 at positions 0 may be considered to be directly against a second insulative material corresponding to the insulative support material 20. The first and second insulative materials 30 and 20 may be compositionally the same as one another in some embodiments, or may be compositionally different from one another. For instance, in some embodiments the insulative material 30 may comprise, consist essentially of, or consist of silicon nitride; and the insulative material 20 may comprise, consist essentially of, or consist of silicon dioxide.

The conductive structures 10 may comprise any suitable electrically conductive composition(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

FIG. 11 shows a cross-section of construction 500a along the row 14c of FIG. 2. The construction would have similar configurations along the other rows 14a, 14b and 14d of FIG. 2, with such other configurations connecting the first conductive structures 12 with the second conductive structures 10 at others of the positions 0, 1, 2 and 3 as appropriate relative to the configuration described with reference to FIG. 2.

The second conductive structures 10 shown in FIG. 11 may correspond to conductive lines extending in and out of the page relative to the cross-section of FIG. 11. In some embodiments, the first conductive structures 12 may be considered to be in a row 14c extending in a first direction along the plane of the cross-section of FIG. 11, and the lines corresponding to the second conductive structures 10 be considered to extend in a second direction which is substantially orthogonal to the first direction. The conductive lines corresponding to the second conductive structures 10 may be wordlines or digit lines extending to a memory array. If the conductive lines are wordlines, then the components 18 coupled with the conductive structures 12 may be wordline drivers. If the conductive lines are digit lines, then the components 18 coupled with the conductive structures 12 may be sense amplifiers.

FIG. 2 shows a configuration in which the conductive structures 10 are conductive lines 10. The configuration of FIG. 11 enables each of the conductive lines 10 at position 2 of row 14c of FIG. 2 to be uniquely coupled to a conductive structure 12. Similar configurations along the rows 14a, 14b and 14d of FIG. 2 enable each of the conductive lines 10 within the configuration of FIG. 2 to be uniquely coupled to only one of the conductive structures 12 relative to all others of the conductive lines 10.

The constructions discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly which includes first conductive structures spaced along a first pitch along a cross-section, with the first conductive structures having a first width along the cross-section; and which includes second conductive structures over the first conductive structures and spaced along a second pitch along the cross-section, with the second pitch being less than or equal to about one-half of the first pitch. The second conductive structures have a second width along the cross-section which is less than the first width. More than one of the second conductive structures is directly over each of the first conductive structures along the cross-section. Conductive interconnects extend upwardly from each of the first conductive structures to couple each of the first conductive structures with only one of the second conductive structures directly over each of the first conductive structures. Some of the second conductive structures are directly over the first conductive structures and are not coupled to the first conductive structures through the conductive interconnects. Said some of the second conductive structures are vertically spaced from the first conductive structures by intervening insulative material.

Some embodiments include a method of forming an integrated assembly. First conductive structures are formed within an insulative support material and are spaced along a first pitch along a cross-section. Upper regions of the first conductive structures are removed to form first openings extending through the insulative support material and over remaining lower regions of the first conductive structures. Outer lateral peripheries of the first openings are lined with spacer material. The spacer material is configured as tubes having second openings extending therethrough to the remaining lower regions of the first conductive structures. Conductive interconnects are formed within the second openings. Second conductive structures are formed over the spacer material and the conductive interconnects. The second conductive structures are spaced along a second pitch along the cross-section, with the second pitch being less than or equal to about one-half of the first pitch. Some of the second conductive structures are electrically coupled to the first conductive structures through the conductive interconnects along the cross-section, and some of the second conductive structures are directly over the first conductive structures along the cross-section and are spaced from the first conductive structures by the spacer material.

Some embodiments include a method of forming an integrated assembly. Conductive structures are formed within an insulative support material and are arranged in rows. The rows extend along a first direction. The conductive structures within each row are spaced along a first pitch along a cross-section. Adjacent rows are offset relative to one another along the first direction by an increment which is a fraction of the first pitch. Upper regions of the conductive structures are removed to form first openings extending through the insulative support material and over remaining lower regions of the conductive structures. Outer lateral peripheries of the first openings are lined with spacer material. The spacer material is configured as tubes having second openings extending therethrough to the remaining lower regions of the conductive structures. Conductive interconnects are formed within the second openings. Conductive lines are formed to extend along a second direction which is substantially orthogonal to the first direction. The conductive lines are spaced from one another along the first direction by a second pitch corresponding to the increment. The conductive lines are electrically coupled to the conductive structures through the conductive interconnects, with each of the conductive lines being uniquely coupled to only one of the conductive structures relative to all others of the conductive lines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an integrated assembly, comprising:
    forming first conductive structures within an insulative support material and spaced along a first pitch along a cross-section;
    removing upper regions of the first conductive structures to form first openings extending into the insulative support material and to remaining lower regions of the first conductive structures;
    lining outer lateral peripheries of the first openings with spacer material; the spacer material being configured as tubes having second openings extending therethrough to the remaining lower regions of the first conductive structures;
    forming conductive interconnects within the second openings; and
    forming second conductive structures over the spacer material and the conductive interconnects; the second conductive structures being spaced along a second pitch along the cross-section with the second pitch being less than or equal to about one-half of the first pitch; some of the second conductive structures being electrically coupled to the first conductive structures through the conductive interconnects along the cross-section, and some of the second conductive structures being directly over the first conductive structures along the cross-section and being spaced from the first conductive structures by the spacer material.

2. The method of claim 1 wherein the lining of the outer lateral peripheries of the first openings with the spacer material comprises:
    forming a layer of the spacer material over the insulative support material and within the first openings; the layer only partially filling the first openings and narrowing the first openings; and
    anisotropically etching the layer to form the spacer material into the tubes having the second openings extending therethrough.

3. The method of claim 1 wherein the forming of the conductive interconnects within the second openings comprises:
    forming conductive material over the insulative support material and within the second openings; and
    removing the conductive material from over the insulative support material with a planarizing process which forms the conductive interconnects from the conductive material, and which forms a planarized upper surface along the insulative support material, along the spacer material, and along the conductive material of the conductive interconnects.

4. The method of claim 1 wherein the second conductive structures are formed directly on the planarized upper surface.

5. The method of claim 1 wherein the spacer material is a same composition as the insulative support material.

6. The method of claim 1 wherein the spacer material is not a same composition as the insulative support material.

7. A method of forming an integrated assembly, comprising:
    forming conductive structures within an insulative support material and arranged in rows, the rows extending along a first direction; the conductive structures within each row being spaced along a first pitch along a cross-section; adjacent rows being offset relative to one another along the first direction by an increment which is a fraction of the first pitch;
    removing upper regions of the conductive structures to form first openings extending through the insulative support material and over remaining lower regions of the conductive structures;
    lining outer lateral peripheries of the first openings with spacer material; the spacer material being configured as tubes having second openings extending therethrough to the remaining lower regions of the conductive structures;
    forming conductive interconnects within the second openings; and forming conductive lines extending along a second direction which is substantially orthogonal to the first direction; the conductive lines being spaced from one another along the first direction by a second pitch corresponding to the increment; the conductive lines being electrically coupled to the conductive structures through the conductive interconnects, with each of the conductive lines being uniquely coupled to only one of the conductive structures relative to all others of the conductive lines.

8. The method of claim 7 wherein the conductive lines are wordlines which extend to a memory array.

9. The method of claim 7 wherein the conductive lines are digit lines which extend to a memory array.

10. The method of claim 7 wherein the lining of the outer lateral peripheries of the first openings with the spacer material comprises:

forming a layer of the spacer material over the insulative support material and within the first openings; the layer only partially filling the first openings and narrowing the first openings; and anisotropically etching the layer to form the spacer material into the tubes having the second openings extending therethrough.

11. The method of claim 7 wherein the forming of the conductive interconnects within the second openings comprises:

forming conductive material over the insulative support material and within the second openings; and removing the conductive material from over the insulative support material with a planarizing process which forms the conductive interconnects from the conductive material, and which forms a planarized upper surface along the insulative support material, along the spacer material, and along the conductive material of the conductive interconnects.

12. The method of claim 11 wherein the conductive lines are formed directly on the planarized upper surface.

13. The method of claim 7 wherein the spacer material is a same composition as the insulative support material.

14. The method of claim 7 wherein the spacer material is not a same composition as the insulative support material.

* * * * *